United States Patent [19]

Guan et al.

[11] Patent Number: 4,956,788
[45] Date of Patent: Sep. 11, 1990

[54] PC-BASED FT/ICR SYSTEM

[75] Inventors: Shenheng Guan; Patrick R. Jones, both of Stockton, Calif.

[73] Assignee: University of the Pacific, Stockton, Calif.

[21] Appl. No.: 276,979

[22] Filed: Nov. 28, 1988

[51] Int. Cl.[5] .............................. G06F 3/14; G01B 9/02
[52] U.S. Cl. .................................... 364/498; 364/900; 364/921.8; 356/346
[58] Field of Search ............... 364/498, 550, 556, 574, 364/579, 527, 900; 250/281, 282, 283; 356/346

[56] References Cited

U.S. PATENT DOCUMENTS

| | | | |
|---|---|---|---|
| 4,455,624 | 6/1984 | Haag et al. ........................... | 364/900 |
| 4,581,533 | 3/1986 | Littlejohn et al. .................. | 250/282 |
| 4,755,670 | 7/1988 | Syka et al. ........................... | 250/282 |
| 4,799,001 | 1/1989 | Burch .................................. | 356/346 |

OTHER PUBLICATIONS

"Mass Spectrum Data Acquisition System", Instrument Practice, Aug. 1970.

J. H. J. Dawson, "An FTICR Spectrometer Design Philosophy and Practical Realization", *Lesture Notes in Chemistry*, vol. 31, Hartman Publishing (1982), pp. 331-363.

R. J. Doyle, Jr., T. J. Buckley, and R. Eyler, "A Microcomputer Based Fourier Transform Ion Cyclotron Resonance Mass Spectrometric Detection System", *Lecture Notes in Chemistry*, vol. 31, Hartman Publishing (1982), pp. 365-379.

John D. Hays and Robert C. Dunbar, "Array-Processor-Based Fourier-Transform Ion Cyclotron Resonance Mass Spectrometer", *Rev. Sci. Instrum.*, 55(7), American Institute of Physics (1984), pp. 1116-1119.

J. M. Alford, P. E. Williams, D. J. Trevor, and R. E. Smalley, "Metal Cluster Ton Cyclotron Resonance Combining Supersonic Metal Cluster Beam Technology Resonance Combining Supersonic Metal Cluster Beam Technology with FT-ICR", *International Journal of Mass Spectrometry and Ion Processes*, 72, Elsevier Science Publishers B.V. (1986), pp. 33-51.

*Primary Examiner*—Parshotam S. Lall
*Assistant Examiner*—Ellis B. Ramirez
*Attorney, Agent, or Firm*—Townsend and Townsend

[57] ABSTRACT

An apparatus for conducting FT/ICR experimentation and acquiring data using a personal computer and a fast buffer board. The apparatus has the capability of generating an ion excitation signal and acquiring results from the FT/ICR experiment. Those results are then digitized and stored in memory on the fast buffer board. Once the results have been stored in the fast buffer board memory, they are transferred to the personal computer where they can be processed and interpreted by the user.

4 Claims, 7 Drawing Sheets

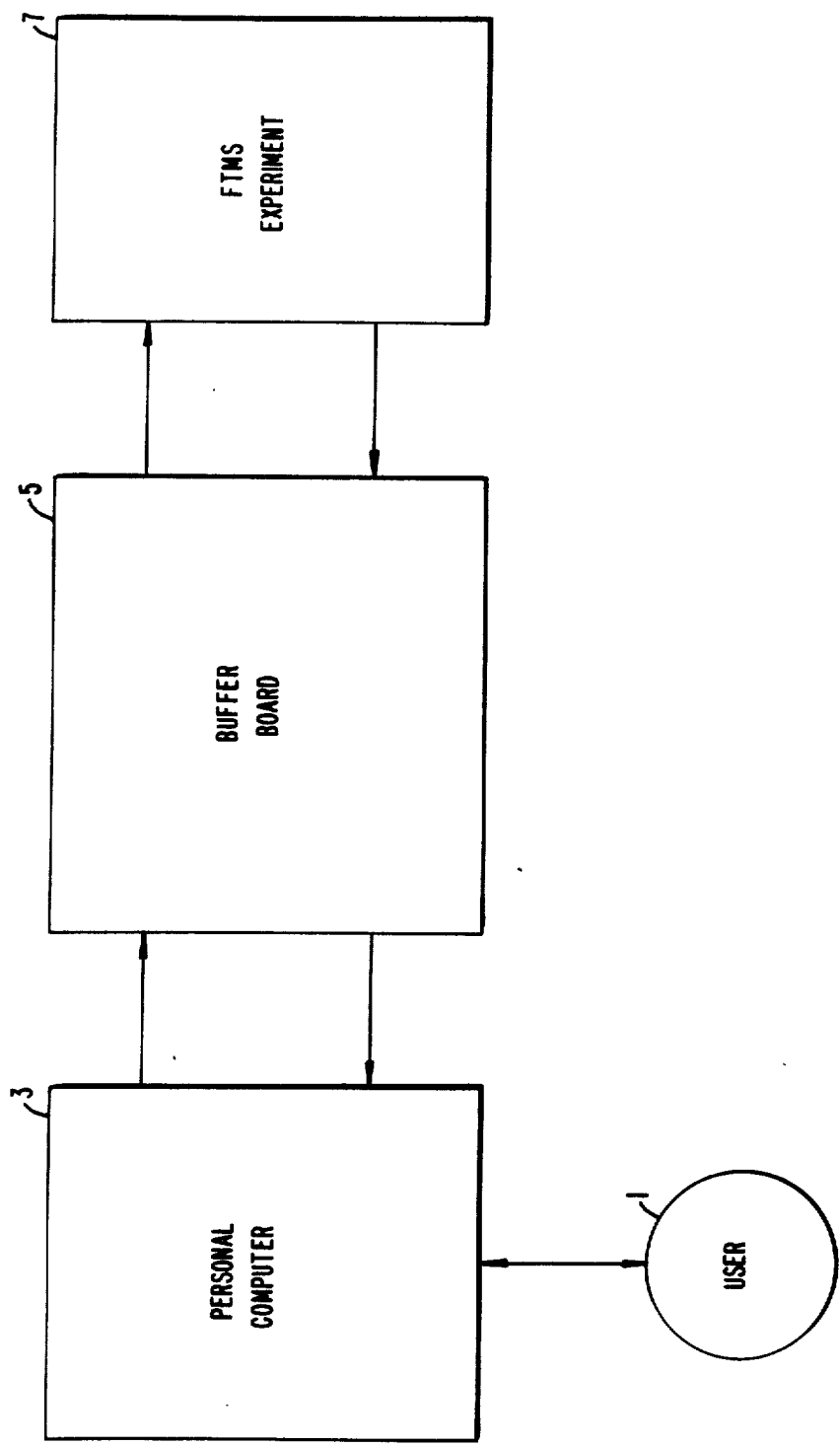
FIG._1.

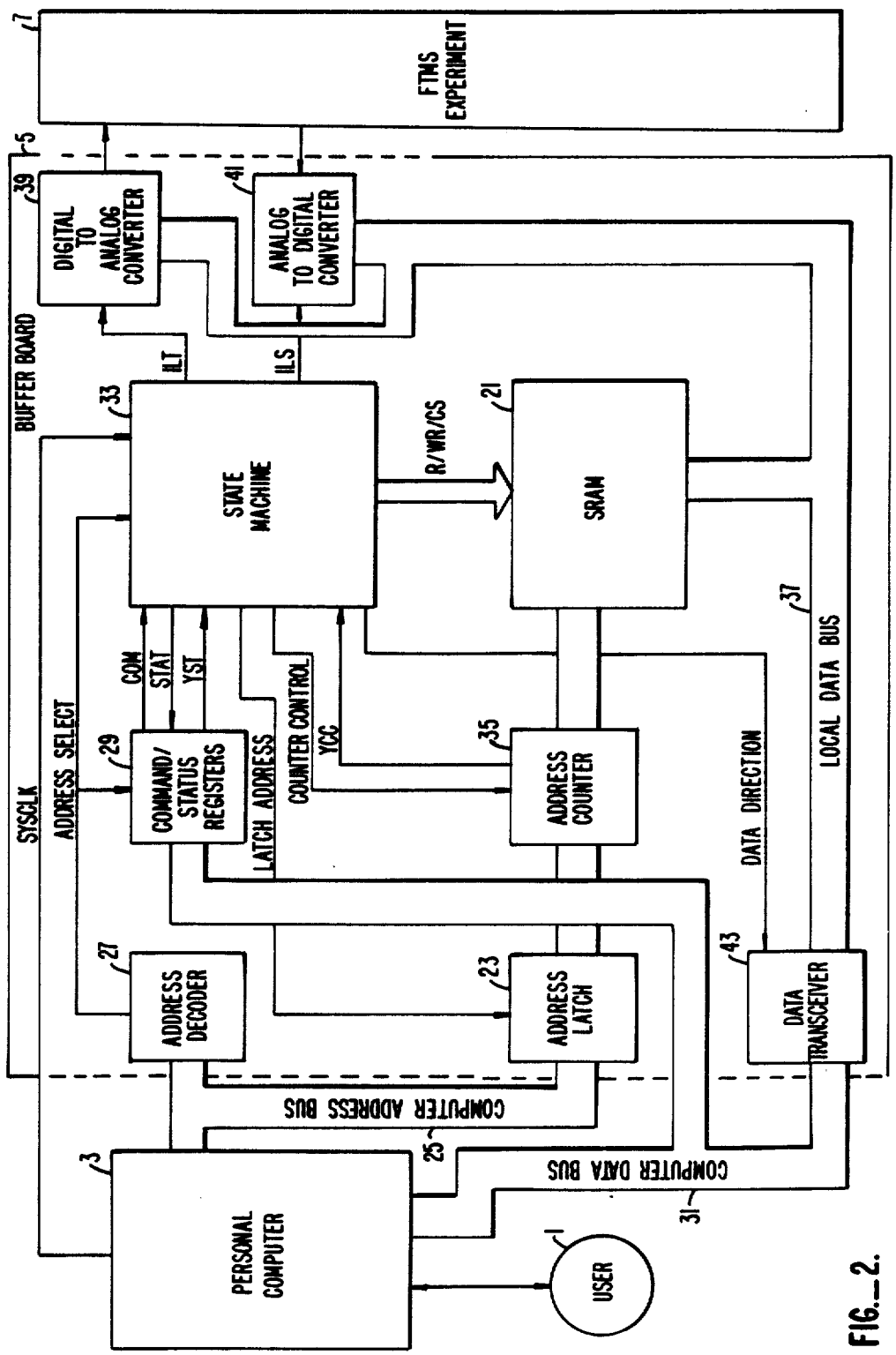
FIG._2.

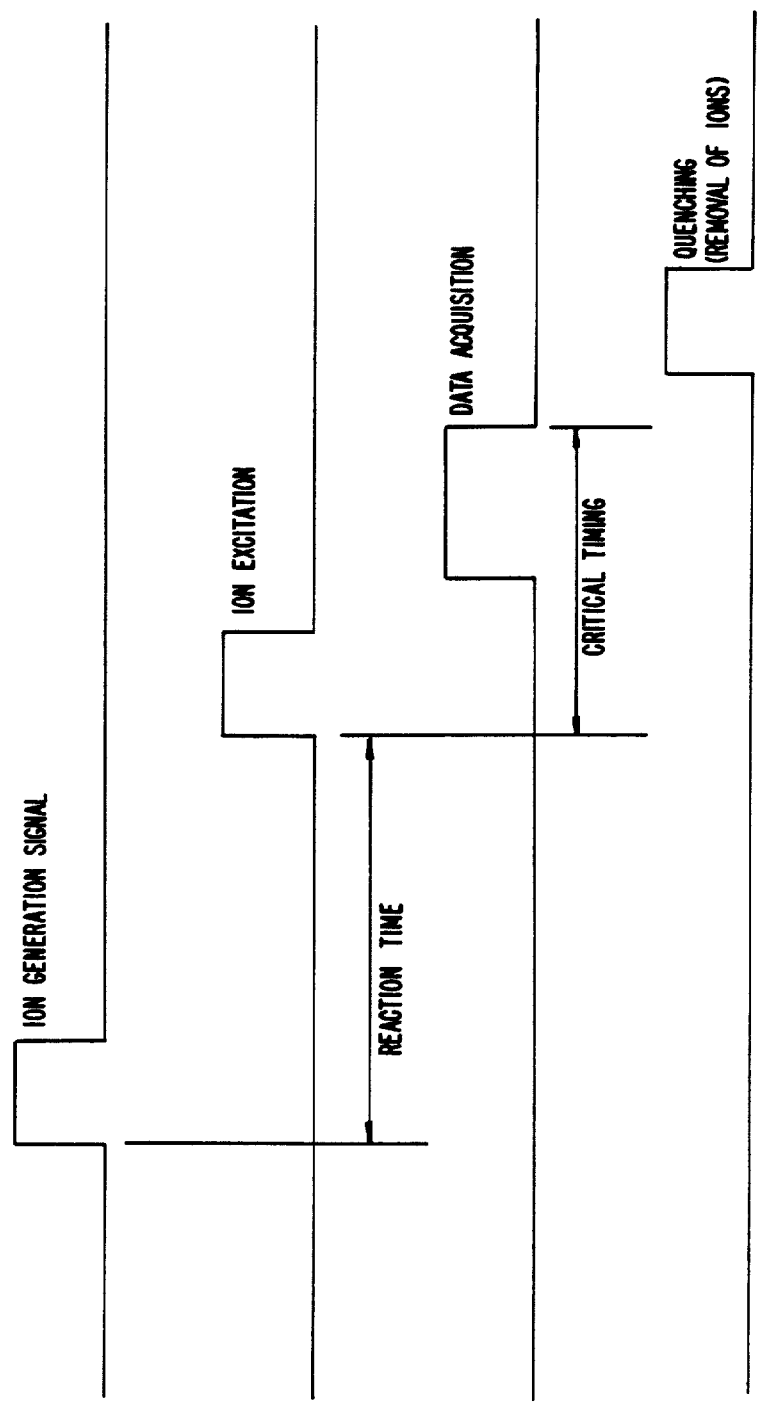
FIG._3.

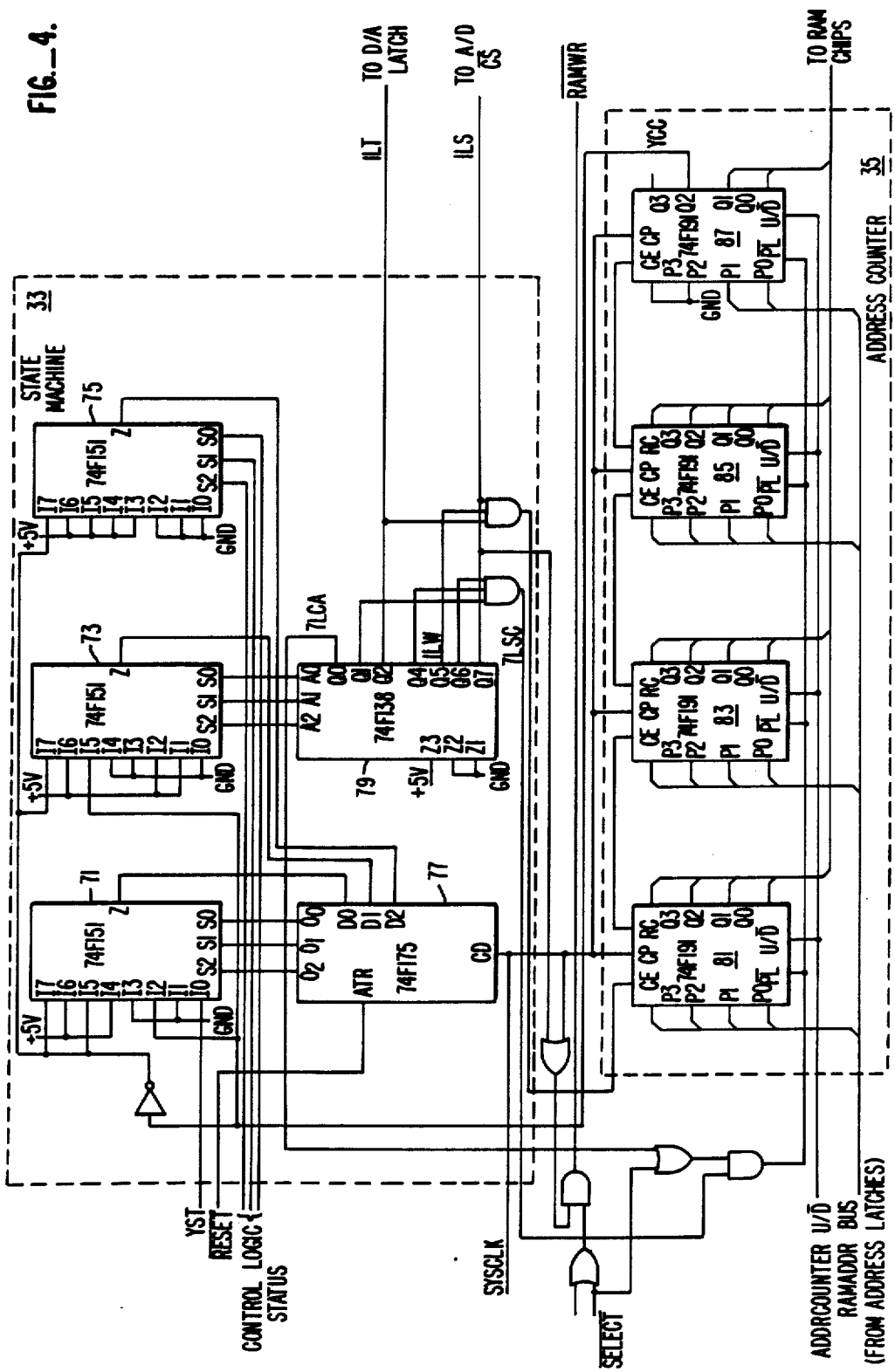

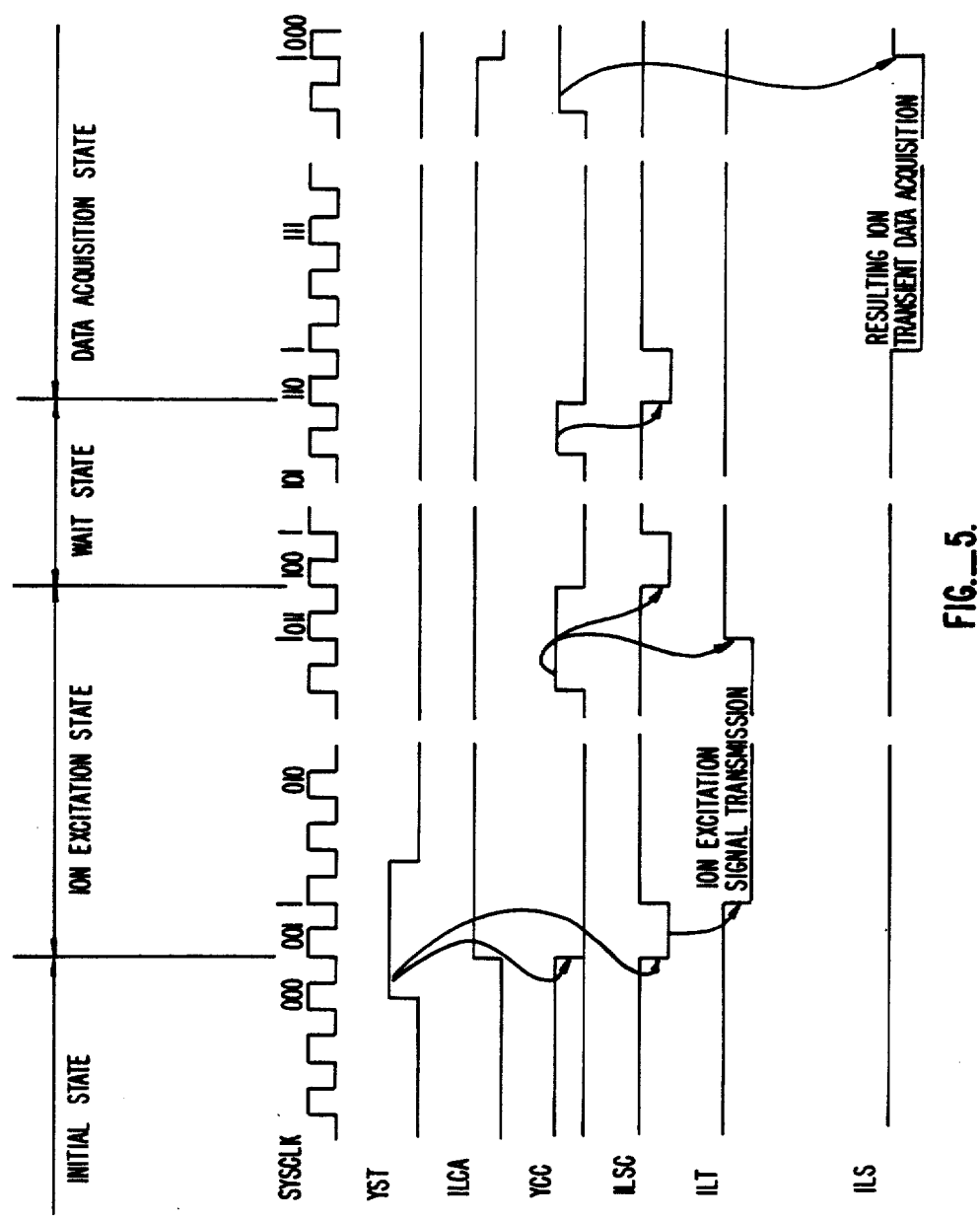
FIG._5.

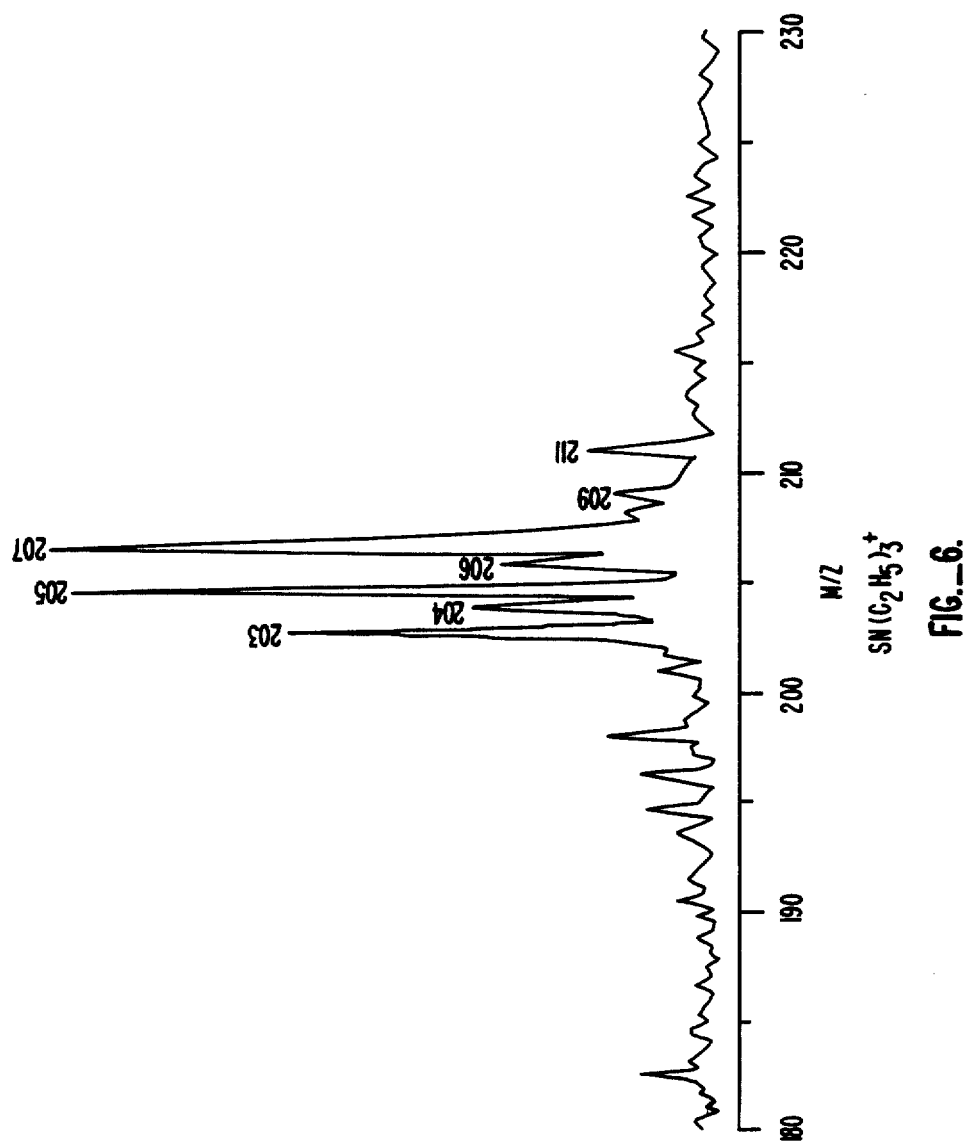
FIG._6.

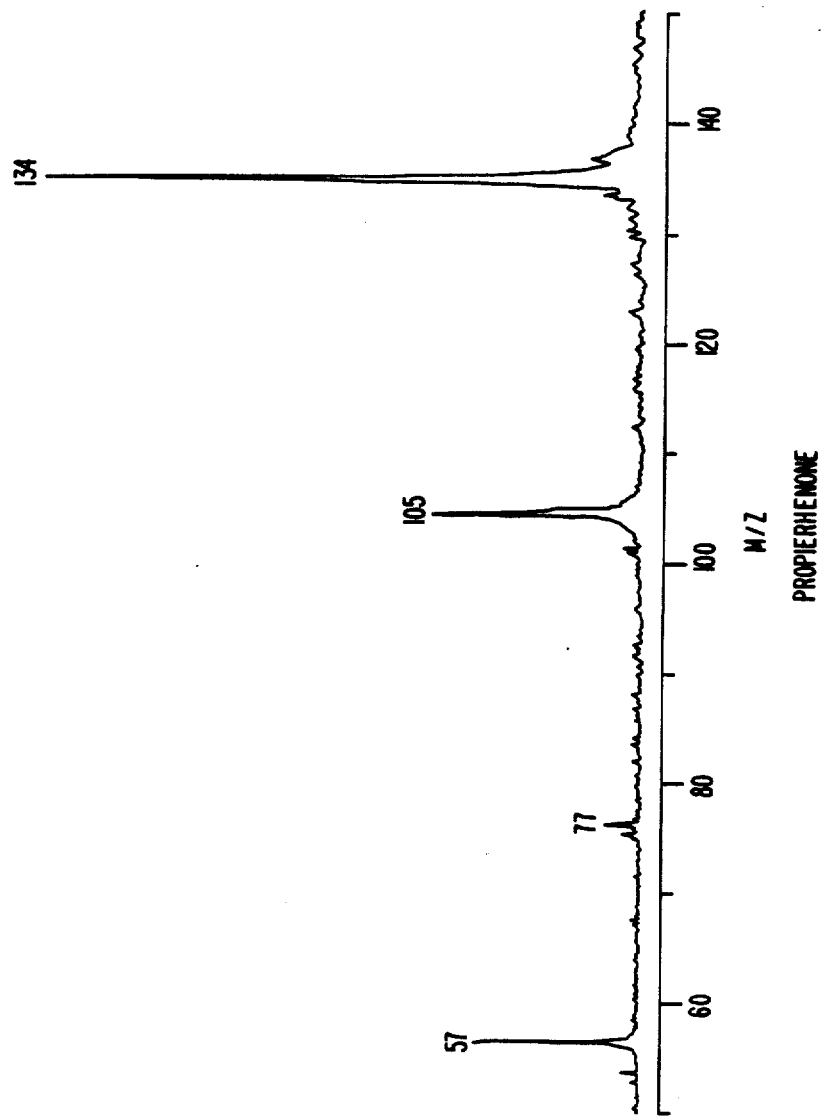
FIG._7.

1

PC-BASED FT/ICR SYSTEM

BACKGROUND OF THE INVENTION

The present invention relates generally to Fourier transform mass spectrometry and more particularly to the manipulation of data in a Fourier transform ion cyclotron resonance (FT/ICR) mass spectrometer.

Chemical applications of Fourier transform ion cyclotron mass spectrometry are fully described in the Accounts of Chemical Research, Vol. 20, page 316, Oct. 1985. Fourier transform spectrometry consists of acquisition of data points as a function of time, followed by discrete Fourier transform to yield the frequency domain spectrum. The major advantages of the Fourier Transform mass spectrometer (FT/ICR) over other mass spectrometer designs are its relatively simple mechanical construction and its use of sophisticated modern electronics and computer engineering, which allow ion manipulations, high mass resolution, large mass range, and simultaneous detection of all the ions.

An ion cyclotron relies on the use of a fixed magnetic field, $\vec{B}$, to deflect an ion of charge, q, moving at a certain velocity, $\vec{v}$, according to the Lorentz force, $F = q\vec{v} \times \vec{B}$. For spatially uniform $\vec{B}$, a moving ion of mass, m, will be bent into a circular path in a plane perpendicular to the magnetic field, with a natural angular frequency, $\omega$, [$\omega = q\vec{B}/m$]. Thus, if the magnetic field strength is known, measurements of the ion cyclotron frequency in eq 1 suffices (in principle) to determine the ionic mass-to-charge ratio, m/q. In other words, in a static magnetic field the mass-to-change ratio is uniquely determined by the ion-cyclotron frequency.

Until now, most of the previous FT/ICR systems have used relatively expensive minicomputers. In addition to the use of a minicomputer, specially dedicated fast hardware memory is needed. The fast hardware is necessary for computers which use dynamic random access memory having its own refresh cycle asynchonous to the execution of instructions. Also, the time necessary for data transfer instructions is generally slow thereby requiring extra hardware control circuitry.

In these FT/ICR systems, a general approach to improve the signal-to-noise ratio is to average the signals. This may be accomplished in two ways. The first is to perform fast Fourier transform (FFT) on each experiment and average them in the frequency domain. This does not require identical phase relationships between each signal subjected to FFT, but does require an enormous number of calculations.

The second method takes time-domain signals, averages a set and performs FFT on the average of the set. In the latter method, the phase relationship between each member of the set must be exactly the same. Fast hardware is necessary to control and monitor the ion-cyclotron events. Problems arise if timing is software controlled unless that computer and its programs are capable of fulfilling the time reproducibility requirement. Only a specialized and expensive computer system can completely fulfill these necessary conditions.

Some previously developed FT/ICR systems involve the use of multiple processors. For example, there is a system described in Lecture Notes in Chemistry (Springer, Berlin, 1982) Vol. 31, p. 365, written by R. J. Doyle, Jr., T. J. Buckley, and J. R. Eyler. In this system a Kim-1 microcomputer was used to perform routine tasks of timing and data processing necessary to obtain ion excitation data from the system. An Apple II microcomputer was then used to carry out further processing and handling of the acquired ion excitation data. In effect, the Kim-1 microcomputer takes the place of the specially dedicated fast control hardware needed in the computer system discussed above.

Since the Kim-1 microcomputer is limited in speed and in memory, it does not have the ability to accomplish all the necessary steps to control and monitor the detailed ion-cyclotron events. External devices are used, including an "excitation oscillator" or waveform generator, and a "waveform recorder" or waveform digitizer.

The Kim-1 acts as a specially dedicated hardware device capable of reproducing the necessary time and phase relationship between ion excitation and data acquisition. Therefore, it can be used together with the waveform generator and the waveform digitizer as a data handling device between the FT/ICR experiment and the Apple II microcomputer. The Apple II microcomputer is then responsible for user interaction, program development, graphics, data storage, and Fourier transformation.

The minicomputer and multiple microcomputer systems described above are capable of carrying out FT/ICR experimentation with accurate results. However, these systems are expensive and require a great deal of hardware in order to effectively test ion samples. A FT/ICR system capable of carrying out accurate FT/ICR experimentation at lesser cost and smaller size would be a great advantage. A cheaper system would make experimentation available to more scientists including those without unlimited resources.

SUMMARY OF THE INVENTION

The present invention is a FT/ICR system for causing ion excitation and acquiring ion transient data using a personal computer and a buffer board. This invention makes FT/ICR experimentation available to any scientist with a personal computer and the appropriate equipment necessary for ion excitation experimentation.

According to the invention a personal computer ("PC") is used to send an ion excitation signal to a buffer board. The buffer board receives the ion excitation signal and stores it in a static random access memory device ("SRAM"). The buffer board then transmits the ion excitation signal to the FT/ICR experiment where the ions are excited according to the ion excitation signal. The resulting ion transient data is then acquired by the buffer board where it is written into the memory location which previously held the ion excitation signal. From there the resulting ion transient data is sent to the PC where the data can be processed and interpreted by the user.

Several major improvements over previous FT/ICR designs are realized by the invention. One is the use of a powerful personal computer which has high performance, low cost, widespread familiarity, and abundant software for graphics, calculations and data handling. A second is the use of a single, simple extension board that replaces the expensive high speed waveform generator, the expensive waveform digitizer, and the control hardware. Since the ion excitation and the transient acquisition take place sequentially, only one common bank of memory is used. That memory bank is mapped directly into the computer's system memory. The latter allows the data transfer rate to be maximized. In addition to the speed gained, the cost of the buffer board is decreased by using the common memory.

The invention will be better understood by reference to the following detailed description taken in connection with the accompanying drawings.

BRIEF DESCRIPTION OF THE DRAWINGS

FIG. 1 is a block diagram of the PC-Based FT/ICR system;

FIG. 2 is a block diagram of the PC-Based FT/ICR system showing a detailed block diagram of the layout of the buffer board;

FIG. 3 is a timing diagram illustrating the signals in the basic FT/ICR chemical cycle;

FIG. 4 is a schematic of the buffer board state machine and address counter configuration in a preferred embodiment;

FIG. 5 is a timing diagram illustrating the control signals on the buffer board used during an FT/ICR experiment.

FIG. 6 is a chart illustrating a sample Fourier transform ion cyclotron resonance spectrum of $Sn(C_2H_5)_3^+$ Ions.

FIG. 7 is a chart illustrating a sample Fourier transform ion cyclotron resonance spectrum of propiophenone.

DETAILED DESCRIPTION OF THE PREFERRED EMBODIMENT

The present invention is a buffer board for interfacing between a personal computer and a FT/ICR experiment. Referring now to the drawings, where like reference numerals denote identical or corresponding parts throughout the several figures. FIG. 1 is a basic block diagram showing the PC-based FT/ICR system. The user 1 interacts with the personal computer (PC) 3 so that s/he may easily control FT/ICR experimentation. The PC 3 is connected to the buffer board 5. The user 1 initiates FT/ICR experimentation at which time an ion excitation signal is transmitted to the buffer board 5 where it is stored in the buffer board internal memory. Once the ion excitation signal is stored in the buffer board internal memory, it is transmitted to the FT/ICR experiment 7 where ion excitation occurs in accordance with the ion excitation signal. After the ions are excited data acquisition begins and the results of the FT/ICR experiment 7 are transmitted back to the buffer board 5. The resulting ion transient data is stored in the buffer board internal memory by overwriting the ion excitation signal which was originally stored in the buffer board internal memory when received from the PC 3.

When the FT/ICR experiment 7 has performed experimentation on the entire ion excitation signal and the resulting ion transient data is stored in the buffer board internal memory, the PC 3 transfers it to the PC base memory. The user 1 can then access the resulting ion transient data through the PC 3. The ion-excitation process may consist of one or more ion-excitation signals being sent to the FT/ICR experiment prior to the acquisition of the ion transient data.

FIG. 2 is a block diagram illustrating the PC-based FT/ICR system shown in FIG. 1 including a more detailed block diagram of the buffer board 5. When the computer power is turned on, the buffer board 5 is reset for loading the ion excitation signal into the static random access memory device (SRAM) 21 on the buffer board 5. After the SRAM 21 is loaded with the ion excitation signal, the address latch 23 is loaded by the PC 3 through the computer address bus 25 with a first address representing the SRAM memory location containing the starting point of the ion excitation signal. Once the address is latched in the address latch 23, the PC 3 uses address decoder 27 to load the command register 29 with the start operation signal. The start operation signal causes the state machine (SM) 33 to issue a command on the counter control line to load the start address into the address counter 35. Once the SM 33 has received the start operation command from the command register 29, it controls the FT/ICR system until the experiment is complete or the buffer board 5 receives a reset signal from the PC 3. At this point the buffer board is ready to transmit the ion excitation signal to the FT/ICR experiment 7.

The ion excitation signal is transmitted to the FT/ICR experiment. This is accomplished by the SM 33 issuing a read command to the SRAM 23. The ion excitation signal is read out on the local data bus 37 where it goes to the digital to analog converter ("DAC") 39. This is achieved by the SM 33 issuing an excitation control signal to the digital to analog converter 39 on the excitation control line. The ion excitation signal is then passed from the SRAM 23 on the local data bus 37 to the DAC 39. From there it is converted from a digital signal to an analog signal and output to the FT/ICR experiment 7 where the ions are excited according to that signal.

After the SM 33 has loaded the address of the starting point for the ion excitation signal to the address counter 35, the second address which determines the time length between the end of ion excitation and the beginning of data acquisition ("wait state") is loaded into the address latch 33. Then the PC 3 continuously checks the status register 29 to determine whether the ion excitation signal has been transmitted to the FT/ICR experiment 7. When transmission is complete, the PC 3 loads the new SRAM starting address for data acquisition into the address latch 23. The SM 33 has now entered the wait state. When the wait period, determined by the second address, has expired, the SM 33 issues a command to load the address counter 35 with the starting address for data to be stored in the SRAM 21. Now, the buffer board 5 is ready to begin acquiring data from the FT/ICR experiment 7 and storing that data in the SRAM 21.

Data acquisition is started when the SM 33 issues a data acquisition control signal to the analog to digital converter ("ADC") 41. This signal enables the ADC 41 allowing it to receive the resulting ion transient data, convert it from analog form to digital form, and transmit it on the local data bus 37 to the SRAM 21. The data is stored in the same SRAM where the ion excitation signal was originally stored.

After data acquisition is complete, the SM 33 returns to its original state thereby allowing the PC 3 to access the SRAM 21. It is the PC 3 which has the responsibility of retrieving and saving the resulting ion transient signal present in SRAM 21 within the PC 3 memory. In that way further experimentation can be carried out without writing over the resulting ion transient data obtained from previous experiment trials. Once the resulting ion transient data is in the PC 3 memory, it can be manipulated, Fourier transformed, and saved in permanent storage by the user 1.

FIG. 3 illustrates the precise timing interval set up between ion excitation and data acquisition. Interaction between the SM 33 and the address counter 35 on the buffer board 5 performs the critical timing needed to: (1) transmit the ion excitation signal to the FT/ICR experiment 7, (2) wait for a specified reaction time, and (3) cause the data acquisition.

The FT/ICR system has a state machine and an address counter which interact to reproduce a precise timing interval. This precise timing interval is critical to achieve accurate results in the FT/ICR system. The reason for this is that once the resulting ion transient data is acquired the signals are averaged together in the time domain. Fourier transformation is then carried out on the sample average. If the timing of each sample is not exactly the same, the averaging process will produce inaccurate results.

FIG. 4 shows a schematic of a preferred embodiment of the SM 33 and the address counter 35 on the buffer board 5. Interaction between the SM 33 and the address counter 35 allows the buffer board 5 to perform the precise timing interval illustrated in FIG. 3. Initially, the command register issues a reset signal. This resets the state machine 33 to an initial wait state. When the command register 29 issues a start operation command (YST) the timing interval is started.

The YST signal is received on the $I_0$ line of the first multiplexer 71. This results in the the first multiplexer output (Z) line going high. The Z-outputs of all three multiplexers 71, 73, 75 are fed into the D-inputs of the flip flop 77. After the start operation is issued, the D-inputs are 001. The 001 is then passed to the Q-outputs of the flip flop 77 on the next clock cycle. At this time a first address is loaded into the address counter 35 which represents the time period for ion excitation.

Propagation of the 001 through the multiplexers 71, 73, 75 places the select inputs of the multiplexers 71, 73, 75 at 010. This places a 010 on the A-inputs of the decoder 79 which issues a signal to the DAC 41 to transmit the ion excitation signal to the FT/ICR experiment 7.

The SM 33 waits until the counter carry line (YCC) goes high. At that point, the outputs to the flip flop change to 011. In the 011 state no instructions are given. The 011 state may, in the future, be used for other optionally implemented functions. After the 011 state, the SM 33 goes to 100 causing the address counter 35 to be loaded with a second address representing a waiting period. Next, a 101 is placed on the outputs of the flip flop. This moves the state machine 33 into the wait state in which the SM 33 waits for a signal to be received before instructing the ADC 43 to begin data acquisition. A second YCC signal is produced by the address counter 35 causing termination of the wait state. After YCC is received, the address counter 35 is preset to a third address so that the buffer board 5 is ready to begin storing data in the SRAM 21.

When the address counter 35 is preset, the YCC line is forced low. The buffer board 5, starts to acquire data from the FT/ICR experiment 7. The resulting ion transient data is stored in the SRAM 21 and when sampling is completed, the YCC line again goes high. This signifies data acquisition is complete and the process is ready to be repeated on a new sample.

The address counter 35 is actually comprised of four separate counters connected for synchronous operation. The address counter is set up so that the first counter 81 counts up/down and then when it reaches its maximum/minimum count it sends a signal to the second counter 83 to enable it to count. The second counter 83 is connected to the third counter 85 and the third counter is connected to the fourth counter 87 in the same way. Therefore, the four counters 81, 83, 85, 87 work together as one counter with the fourth counter providing the counter carry to the SM 33.

The counter carry signal plays an essential role in carrying out the critical timing on the buffer board. This signal is fed back to the multiplexers 73, 75, 77 and the decoder 79 to establish the different timing operations.

The address counter 35 is connected to the system clock and the first counter 83 is enabled by a signal generated through the decoder 79, the ramaddr select signal, and the gating circuitry connected between the SM 33 and the address counter 35. The counters 81, 83, 85, 87 are also connected to a local address bus so that an address can be directly input to the counters 81, 83, 85, 87 from the address latch 23.

FIG. 5 is a timing diagram showing the various timing signals as they occur in the operation of the SM 33 and the address counter 35 described in FIG. 4. The first two signals represent signals from the PC 3. The first signal shown is the system clock (sysclk). The second signal is the start operation signal (YST) which is transmitted to the buffer board 5 by the PC 3. When YST goes high, the buffer board 5 begins to operate. At this point, the third signal, the computer access signal (ILCA), goes high. While ILCA is high the buffer board 5 is in control of FT/ICR experimentation.

The fourth signal shown is the counter carry signal (YCC). YCC is an output from the fourth counter 87 which terminates the counting operation of the address counters 81, 83, 85, 87. It is the signal which is critical to the operation and timing of the buffer board 5. When YCC goes high the first time, it enables the SM 33 to enter a wait state. The SM 33 waits an amount of time equal to the time it takes to count out from the address in the address counter 35. When the address counter 35 counts out, a second YCC signal occurs. This signifies that the buffer board 5 can begin to acquire data from the FT/ICR experiment 7.

The fifth signal is the set address counter signal (ILSC). This signal is an output from the gating circuitry and it allows the address counter 35 to be set. ILSC is first active after the start operation signal is received. When the start operation signal is received the address counter 35 is set up to count to a value which provides the buffer board 5 with an amount of time for transmitting an ion excitation signal. After ion excitation, ILSC is active again and the address counter 35 is set for counting a value. This value provides the buffer board 5 with a proper delay. This delay expires at the precise time that data acquisition is to begin. Therefore, when the address counter 35 counts out YCC goes high and data acquisition begins.

ILSC is active for a third time after completion of the wait state. At this point, after the address counter 35 has counted out for the delay, it is preset to an initial address. This means that when data acquisition begins, the resulting ion transient data will be stored in the same memory where the ion excitation signal was stored.

The transmit data signal (ILT) is the sixth signal. ILT represents the point in time when the ion excitation signal is transmitted to the FT/ICR experiment 7. This occurs after the address counter 35 has been set for the first time.

The sample data signal (ILS) is the seventh signal. ILS represents the data acquisition mode of the buffer board 5. It occurs when YCC is active for the final time in the cycle.

FIG. 5 also includes a description of what state the buffer board 5 is in throughout the timing cycle. At first, the buffer board is in the initial state. Then it moves into the ion excitation state upon receipt of YST. A wait state is then entered after the ion excitation signal has been transmitted. Finally, when YCC is active the second time, the board goes into the data acquisition state.

FIG. 6 is a chart illustrating the mass (m) to charge (z) ratio of a sample of $Sn(C_2H_5)_3^+$ resulting from a FT/ICR experiment. The instrument parameters were the following: a 70 eV electron beam of 500 nA was turned on for 30 ms; tetraethyltin pressure was $3 \times 10^{-7}$ Torr; reaction time was 1.1 sec; sampling rate was 2 MHz; and a total of 10 time domain ion cyclotron resonance signals were averaged to produce the resulting data.

FIG. 7 is a chart illustrating the mass (m) to charge (z) ratio of a sample of propiophenone resulting from a FT/ICR experiment. The instrument parameters were the following: a 70 eV electron beam of 200 nA was turned on for 15 ms; tetraethyltin pressure was $2 \times 10^{-6}$ Torr; and reaction time was 300 ms. The excitation function was synthesized from a squarewave in a power spectrum with random phases. A total of 200 time domain ion cyclotron resonance signals were averaged to produce the resulting data.

In general, to those skilled in the art to which this invention relates, many changes in construction and widely differing embodiments and applications of the present invention will suggest themselves without departing from its spirit and scope. Thus, the disclosures and descriptions herein are purely illustrative and are not intended to be in any sense limiting.

What is claimed is:

1. In a Fourier transform ion cyclotron resonance mass spectrometer ("FT/ICR"), a system, utilizing a personal computer ("PC") for providing an ion excitation signal and acquiring and storing resulting ion transient data, the system capable of setting up a precise timing interval between the beginning of ion excitation and the end of data acquisition, comprising:
   a static random access memory device ("SRAM") for storing digital data;
   a digital to analog ("D/A") converter for receiving the ion excitation signal in digital form from said SRAM, converting the ion excitation signal to analog form, and outputting the ion excitation signal in analog form in response to an ion excitation control signal;
   an analog to digital ("A/D") converter for receiving the resulting ion transient data in analog form, converting the resulting ion transient data to digital form, and transmitting the resulting ion transient data in digital form to said SRAM in response to a data acquisition control signal;
   a state machine ("SM") connected to the PC, said SRAM, said D/A converter, and said A/D converter through control lines, said SM for issuing said ion excitation control signal to said D/A converter causing the ion excitation signal to be output, for issuing said data acquisition control signal to said A/D converter causing said A/D converter to start receiving acquired data, and for issuing a read/write control signal to said SRAM, to control ion excitation, data acquisition, and read/write operations in said SRAM, with said SM starting operation upon receipt of a start operation signal from the PC;
   an address counter, connected to said SM and said SRAM, for keeping track of the present memory location of said SRAM and for interacting with said SM such that said SM causes said address counter to be loaded with a selected value and said address counter provides said SM with a count signal every time said address counter counts to a designated value where the occurrence of said count signal causes said SM to issue said data acquisition control signal after the expiration of a predetermined time interval;
   a command register, connected to the PC and said SM, for receiving control signals from the PC and passing said control signals onto said SM;
   a status register, connected to the PC and said SM, for keeping track of the present state of said SM;
   an address latch connected to the PC, said address counter, and said SM for receiving a starting address from the PC and transmitting it to said address counter when issued an address latch control signal by said SM;
   a data transceiver, connected to said SRAM, said SM, and the PC, for controlling data transfer direction between said SRAM and the PC when issued a data direction control signal by said SM; and
   an address decoder, connected to the PC and said SM, said command register, and said status register, for receiving said starting address from the PC and for transmitting a decode signal to said SM so that said SM may issue said address latch control signal causing said address latch to input said starting address to said address counter.

2. The apparatus of claim 1 wherein, interaction between said SM and said address counter is capable of establishing a precise timing interval such that the SM can execute the following steps in a substantially reproducible timing cycle, the steps comprising:
   issuing said ion excitation control signal for disabling said A/D converter and enabling said D/A converter to convert the ion excitation signal from digital to analog form and transmit the ion excitation signal in analog form;
   issuing said data acquisition control signal for disabling said D/A converter and enabling said A/D converter to receive the resulting ion transient data in analog form, convert the resulting ion transient data to digital form, and transmit the resulting ion transient data in digital form to said SRAM; and
   issuing said read/write control signal for enabling said SRAM, upon receiving the resulting ion transient data from said A/D converter, to write the resulting ion transient data into said SRAM in substantially the same memory location which previously held the ion excitation signal.

3. In a Fourier transform ion cyclotron resonance mass spectrometer ("FT/ICR"), a system, of the type including an input computer for providing an ion excitation signal and processing the resulting ion transient data of a FT/ICR experiment, a buffering subsystem for interfacing the input computer to the FT/ICR experiment, comprising:
   a memory;
   control means, connected to said memory, for controlling the buffering subsystem including a state machine (SM) for issuing an ion excitation control signal and a data acquisition control signal to set up a precise timing interval between ion excitation and data acquisition wherein, upon initiation of a FT/ICR experiment said ion excitation signal is stored in said memory and after ion excitation and data acquisition are completed the resulting ion transient data is stored in said memory in substantially the same location where the ion excitation signal was stored;

means for causing the excitation of an ion sample when said ion excitation control signal is received from said control means; and means for acquiring the resulting ion transient data from the FT/ICR experiment and recording the resulting ion transient data in said memory when said data acquisition control signal is received from said control means.

4. In an FT/ICR experimental system, a PC controlled ion excitation and data acquisition subsystem, including a DAC for converting digital waveform data to an excitation waveform and a ADC for converting an analog data waveform to digital data, the subsystem for facilitating data waveform addition to achieve noise reduction, said subsystem comprising:

a memory unit including memory locations accessed by addresses included in a predetermined address space, having a data port coupled to the ADC and DAC, for reading data to said DAC upon receipt of a read enable signal and for writing data from said ADC upon receipt of a write enable signal;

an address counter for sequentially generating address values spanning the address space of said memory, said address counter preloadable to a specific address and for generating a YCC signal upon generating a selected address in said address space;

a state machine for defining an INITIAL state upon receipt of a RST signal from the PC, an ion excitation (IE) state upon receipt of a YST signal from the PC, and a data acquisition (DA) state upon receipt of said YCC signal, with the state machine for issuing memory read enable, address counter enable, and DAC enable control signals during said IE state, and for issuing memory write enable, address counter enable, and ADC enable control signals during said DA state upon completion of a predetermined time interval from the receipt of said YCC signal;

means, controlled by the PC, for loading ion excitation waveform data into sequential storage locations starting at an excitation waveform start address (WFESA) and for preloading said address counter to WFESA prior to said IE state; and means, controlled by the PC, for preloading said address counter to a data acquisition start address.

* * * * *